United States Patent
Bradley

(10) Patent No.: US 8,156,167 B2
(45) Date of Patent: Apr. 10, 2012

(54) ANALOG PSEUDO RANDOM BIT SEQUENCE GENERATOR

(75) Inventor: Donald Anthony Bradley, Morgan Hill, CA (US)

(73) Assignee: Anritsu Company, Morgan Hill, CA (US)

(*) Notice: Subject to any disclaimer, the term of this patent is extended or adjusted under 35 U.S.C. 154(b) by 1292 days.

(21) Appl. No.: 11/752,739

(22) Filed: May 23, 2007

(65) Prior Publication Data

US 2008/0290912 A1    Nov. 27, 2008

(51) Int. Cl.
*G06F 1/02* (2006.01)
(52) U.S. Cl. .................. 708/250; 708/252
(58) Field of Classification Search .......... 708/250, 708/252
See application file for complete search history.

(56) References Cited

U.S. PATENT DOCUMENTS

| | | | |
|---|---|---|---|
| 7,206,334 B2* | 4/2007 | Siwiak | 375/146 |
| 2004/0151506 A1* | 8/2004 | Shiramizu et al. | 398/140 |
| 2006/0173943 A1* | 8/2006 | Luzzi et al. | 708/250 |
| 2008/0024235 A1* | 1/2008 | Chia | 331/78 |

* cited by examiner

*Primary Examiner* — Chuong D Ngo
(74) *Attorney, Agent, or Firm* — Fliesler Meyer LLP

(57) ABSTRACT

A Pseudo Random Bit Sequence (PRBS) generator is provided with components to enable operation at very high microwave frequencies with inexpensive components. The PRBS generator initially replaces the D flip-flops of a conventional PRBS generator with delay lines connected in a similar manner. Further, an exclusive OR (EXOR) gate used in a conventional device is replaced in one embodiment by a mixer and amplifier. In another embodiment, the EXOR gate is replaced by a Gilbert Cell. In some embodiments, complementary outputs of an EXOR gate are connected to separate delay lines to reduce components needed for the PRBS generator.

7 Claims, 10 Drawing Sheets

ANALOG PSEUDO RANDOM BIT SEQUENCE GENERATOR

BACKGROUND

1. Technical Field

The present invention relates to circuitry for an analog pseudo random bit sequence (PRBS) generator that can be used, for example, to exercise digital circuits using pseudo random patterns. The PRBS generator, in another example, can produce analog noise if fed into a digital circuit.

2. Related Art

FIG. 1 shows a block diagram of prior art digital implementation of a PRBS generator. This PRBS generator is used to exercise digital circuits using pseudo random bit patterns. It can also be used to produce analog noise if fed into a D/A converter. The circuit includes D-type flip-flops or registers 101-104 connected in series, and driven by a common clock signal Clk. Each of the registers 101-104 produces a respective tap output Q1-Q4. The Q1 tap from register 101 provides a first input to Exclusive OR (EXOR) gate 106. The Q4 tap produces a second input to the EXOR gate 106. The output D1 of EXOR gate 106 is provided back to the D input of the register 101. FIG. 2 provides a timing diagram showing the outputs from each of the taps Q1-Q4 and the EXOR gate 106 output D1 relative to the clock signal Clk.

FIG. 3 illustrates one alternative connection to FIG. 1 that produces the same pattern as shown in FIG. 2. FIG. 3 modifies FIG. 1 by including a register 301 with inputs connected in parallel with the register 101. The registers 101 and 301 receive a D input from the output of EXOR gate 106, while their clocks are provided by common clock Clk. The Q output of register 301 then matches the Q output of register 101 to produce the Q1 tap signal to an input of the EXOR gate 106.

The characteristics of the circuits of FIGS. 1 and 3 produce a random bit sequence that repeats every $2^{N-1}$ clock cycles. The all "0" state is prohibited, as this will "lock up" the generator. This state must be avoided at start-up. There are tables of tap connection vs. sequence length that are readily available from many sources. As an example, a 4 bit shift register making up a PRBS generator with an EXOR gate as shown in FIGS. 1 and 3 will produce a maximum length sequence of $2^4-1=15$ state changes before repeating the sequence.

There is no inherent upper limit to the frequency of operation with the components of FIGS. 1 and 3, except that of the logic elements used. To reduce the expense for higher frequency PRBS generators, however, there are techniques that allow several lower frequency PRBS generators to be multiplexed to arrive at a higher frequency. The multiplexer is the only element that operates at the elevated frequency. The high frequency multiplexers can be made much more easily than D flip-flops and EXOR gates. The disadvantage of this technique is that the system can become very complex and expensive when system frequencies approach the 10's of GHz range. As an example Anritsu Company of Morgan Hill, Calif. manufactures a 12.5 GHz PRBS generator model MP1763B that sells for over $100,000.

It would be desirable to provide components for a PRBS generator that can operate at frequencies into the 10's of GHz range, while minimizing manufacturing costs.

SUMMARY

According to embodiments of the present invention, a PRBS generator is provided with components to enable operation at very high frequencies. In particular, typical components forming a lower frequency PRBS generator are replaced with microwave components to enable the high frequency operation.

Initially, D flip-flops of a conventional PRBS generator are replaced by delay lines connected in a similar manner. Further, the EXOR gate used in a conventional device is replaced by a mixer and amplifier. Outputs of the delay lines form the RF and LO inputs of the mixer, and the IF mixer output drives the amplifier. The output of the amplifier in one embodiment is connected through a power splitter back to the separate inputs of the delay lines. In another embodiment, the amplifier output drives a first delay line, while the output of the first delay line drives a second delay line. The mixer can be formed by a differential amplifier connected to a diode switch.

In an alternative embodiment of the invention, a Gilbert Cell is used to provide the EXOR gate of a PRBS generator. The Gilbert Cell is connected with two delay lines forming the D flip-flops of the PRBS generator.

In one embodiment, complementary outputs of the EXOR gate are used to reduce circuitry needed for a high frequency PRBS generator. Instead of a single EXOR gate output connected to both delay lines, complementary outputs connect individually to each delay line. The outputs of the delay lines are then connected to separate inputs of the EXOR gate.

BRIEF DESCRIPTION OF THE DRAWINGS

Further details of the present invention are explained with the help of the attached drawings in which.

DETAILED DESCRIPTION

Figure 2:
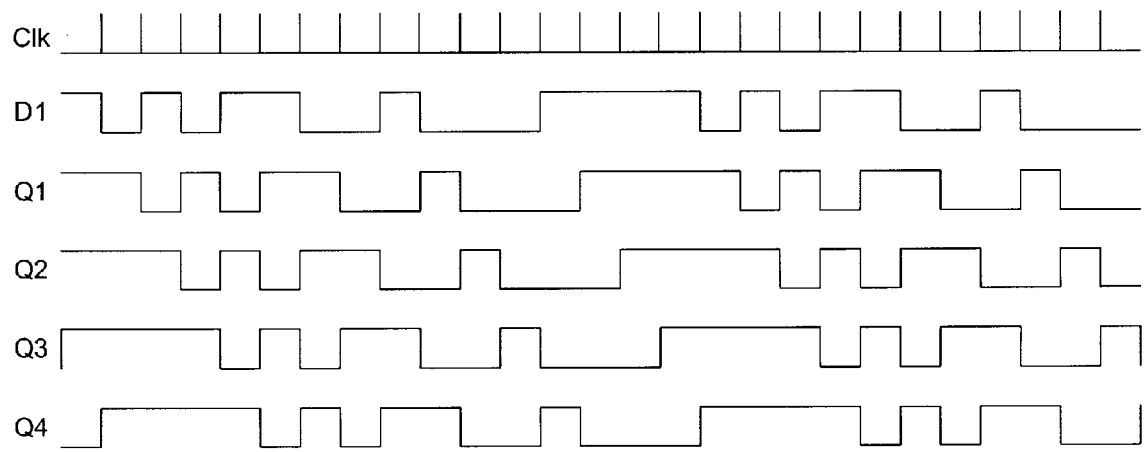
FIG. 2 provides a timing diagram showing the outputs from each of the taps of the circuit in FIG. 1.
Figure 3:
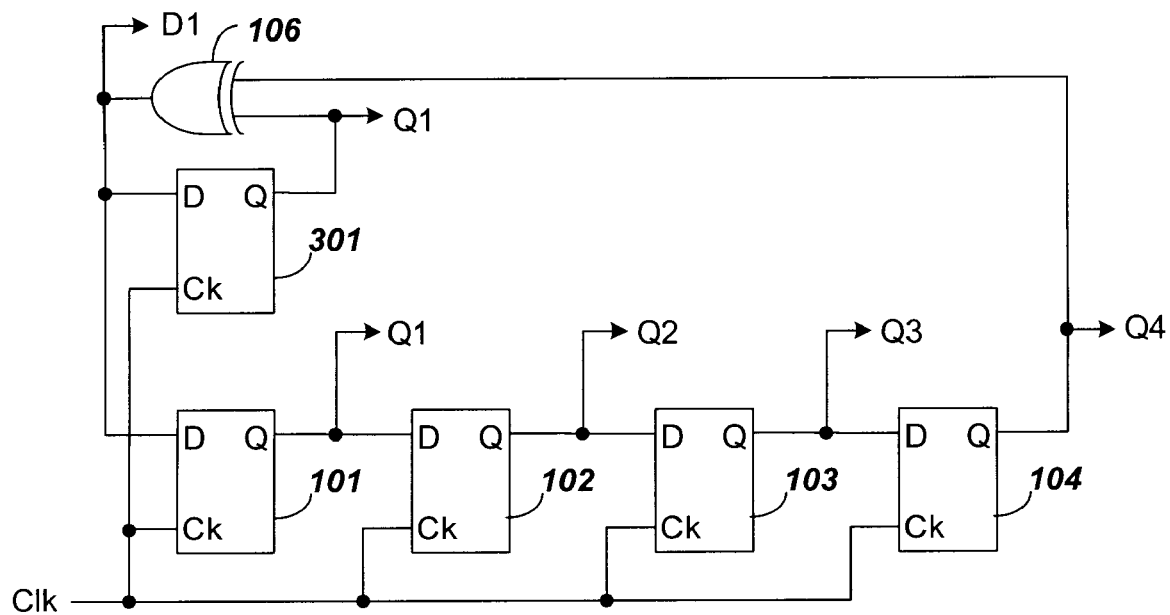
FIG. 3 illustrates one alternative connection to FIG. 1 that produces the same pattern as shown in FIG. 2.
Figure 4:
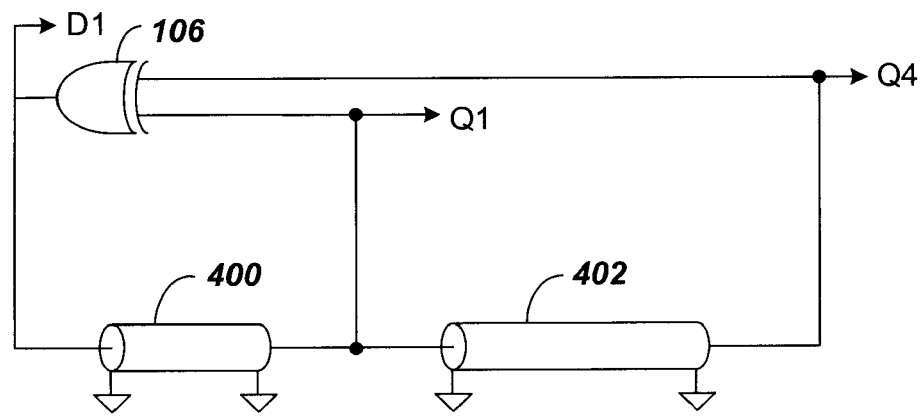
FIGS. 4 and 5 show circuitry for a high frequency PRBS generator according to embodiments of the present invention.
Figure 5:
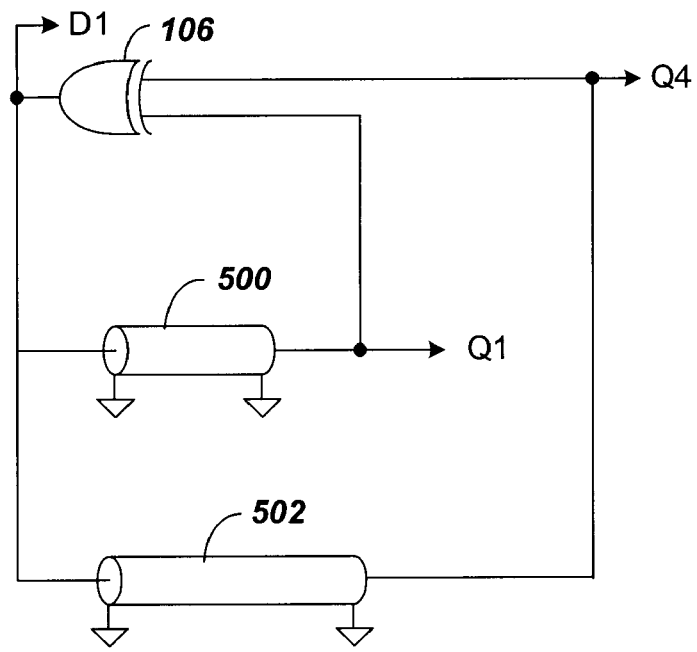

FIGS. 4 and 5 show circuitry for a high frequency PRBS generator according to embodiments of the present invention. FIG. 4 provides an analog conversion from the digital generator of FIG. 1. FIG. 5 provides an analog conversion from the digital PRBS generator of FIG. 3. The circuit of FIG. 5 corresponds with a majority of the analog PRBS circuits subsequently discussed, which is why the circuit of FIG. 3 is discussed in the background and further herein. The implementations of FIGS. 4 and 5 produce signals D1, Q1 and Q4 with a timing diagram as shown in FIG. 2.

Figure 1:
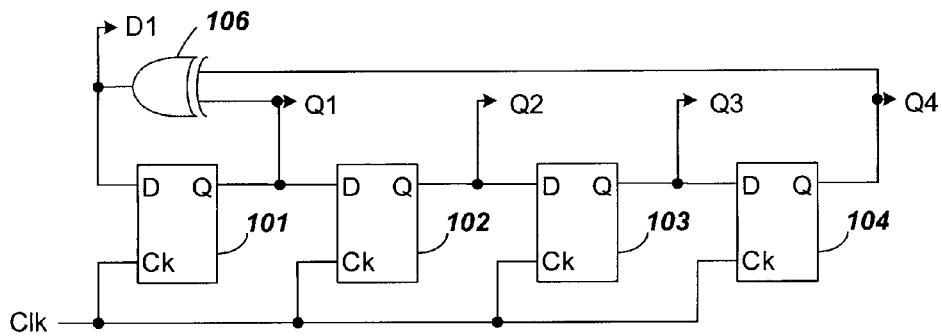
FIG. 1 shows a block diagram of a prior art digital implementation of a PRBS.

In FIGS. 4 and 5, delay lines replace the D flip-flops of respective FIGS. 1 and 3. In FIG. 4, a first delay line 400 connects the output of EXOR gate 106 to a first input of the EXOR gate 106. The first input of the EXOR gate 106 is designated as the Q1 tap. A second delay line 402 connects the tap Q1 to a second input of the EXOR gate 106. The second input of the EXOR gate 106 is designated as the Q4 tap. By selecting appropriate lengths for the delay lines 400 and 402, the number of clock cycles between Q1 and Q4 can be set to match the timing diagram of FIG. 2.

In FIG. 5, the output of the EXOR gate 106 is connected to a first terminal of both the first delay line 500 and a first terminal of a second delay line 502. A second terminal of the first delay line 500 is connected to a first input of the EXOR gate 106 forming the tap Q1. The second terminal of the second delay line 502 is connected to a second input of the EXOR gate 106 forming the Q4 tap. With this connection, the delay line 500 overlaps a portion of the delay line 502, similar to registers 101 and 301 providing overlapping data in FIG. 3. As in FIG. 4 by selecting appropriate lengths for the delay lines 500 and 502, the number of clock cycles between Q1 and Q4 can be set to match the timing diagram of FIG. 2.

To illustrate how delay lines 400, 402, 500 and 502 can replace a "D" flip-flop, the "D" flip-flop can be thought of as a controllable delay where the "Q" output follows the "D" input with a delay of the period of the "CLK" signal. For a given CLK frequency there is a fixed delay for a signal applied to the D flip-flop. Similarly if a signal is placed at the input of a delay line, the signal will appear at the output with a fixed delay.

Delay lines can be made by many techniques. The simplest ones are traces on PC boards and coax cable. For a given impedance (R) and a known capacitance (C), the per foot delay can be calculated by t(Delay)/foot=R*C. For an example, RG174 coax cable has a C per foot of 20 pF and an impedance of 50 Ohms, then t(Delay)/foot=1.45 nS/foot. If a delay of 500 pS were desired, the length of cable needed would be L(desired)=t(Desired)/t(Delay)/foot or 500 ps/1.45 nS=0.345 feet which is 4.14 inches. The delay line will then replace the D flip-flop. All that is left is some gain to make the system regenerative. An amplifier will, thus, be used to complete the system.

Figure 6:
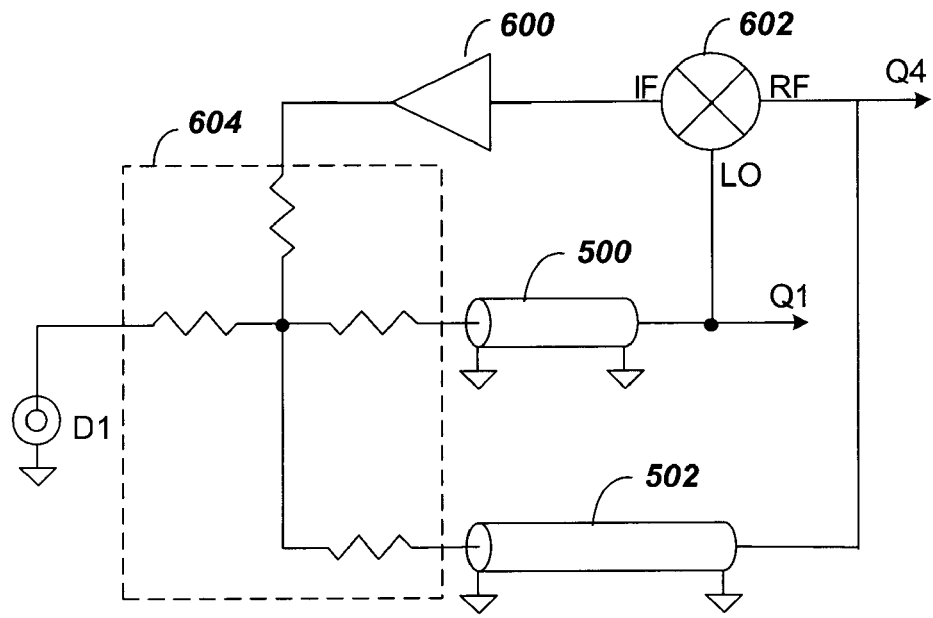
FIG. 6 illustrates one embodiment of circuitry for the invention of FIG. 5, with an amplifier added to create gain, a mixer used to form the EXOR gate, and a power divider interconnecting components.

FIG. 6 illustrates one embodiment of circuitry for the invention of FIG. 5, with an amplifier 600 added to create gain, a mixer 602 used to form the EXOR gate, and a power divider 604 interconnecting components. The mixer 602 has a first (LO) input connected to the output of the delay line 500 and a second (RF) input connected to the output of the delay line 502. The (IF) output of the mixer 602 is provided through amplifier 600 to power splitter 604. The splitter 604 evenly distributes power from the output of amplifier 600 to the delay lines 500 and 502, as well as to a port providing the signal D1.

To illustrate how a mixer can be used for the EXOR gate, the EXOR gate can be thought of as a controllable invert not invert gate. If a logic signal is connected to one input and a "0" is connected to the other input, the EXOR will pass the logic signal through with no inversion. If the other input is replaced with a "1" the logic signal will invert at the output. Similarly if the signals are placed at the "RF" input of a mixer and a "+" voltage is placed at the "LO" port, then the signal will pass through to the "IF" port with no inversion. If a "−" voltage is placed at the "LO" port, the "RF" signal will invert at the "IF" port.

Figure 7:
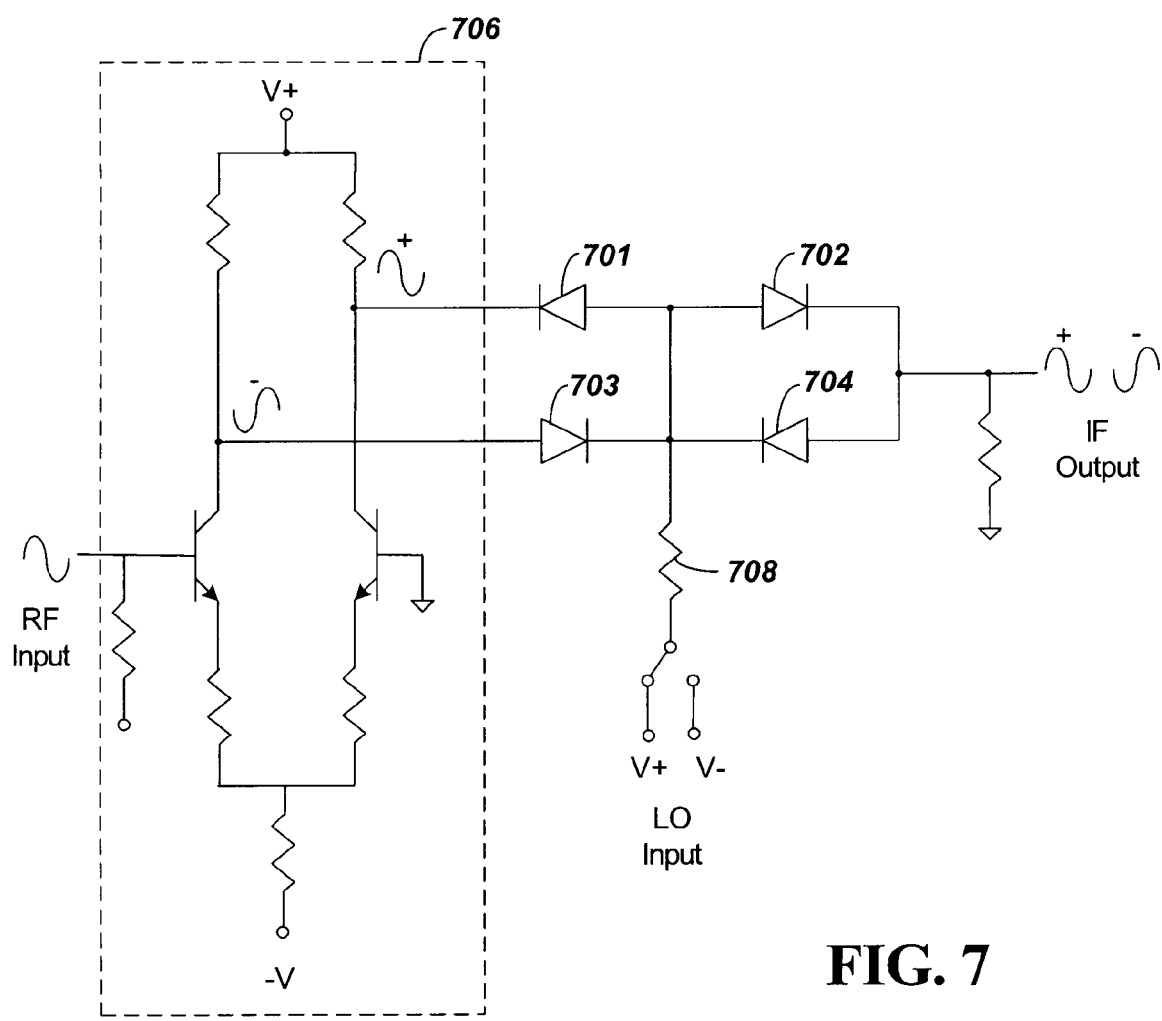
FIG. 7 shows one circuit embodiment for the mixer of the PRBS generator of FIG. 6.

FIG. 7 shows one circuit embodiment for the mixer of the PRBS generator of FIG. 6. The mixer uses a diode switch made up of diodes 701-704. To apply a first RF signal to the diode switch, a differential amplifier 706 is used. The differential amplifier 706 receives the RF input to the mixer and provides two outputs, one inverting (−) and the other non-inverting (+). The diode switch 701-704 serves to select one of the inverting (−) or non-inverting (+) outputs from the differential amplifier 706. A resistor 708 provides a steering current for the selected diodes. The voltage on the resistor 708 drives the diodes 701-704 to select the IF output of the mixer as either a non-inverting gain with a "+" voltage or an inverting gain with a "−" voltage. The mixer design of FIG. 7 maintains the "DC" path through the system.

Figure 8:
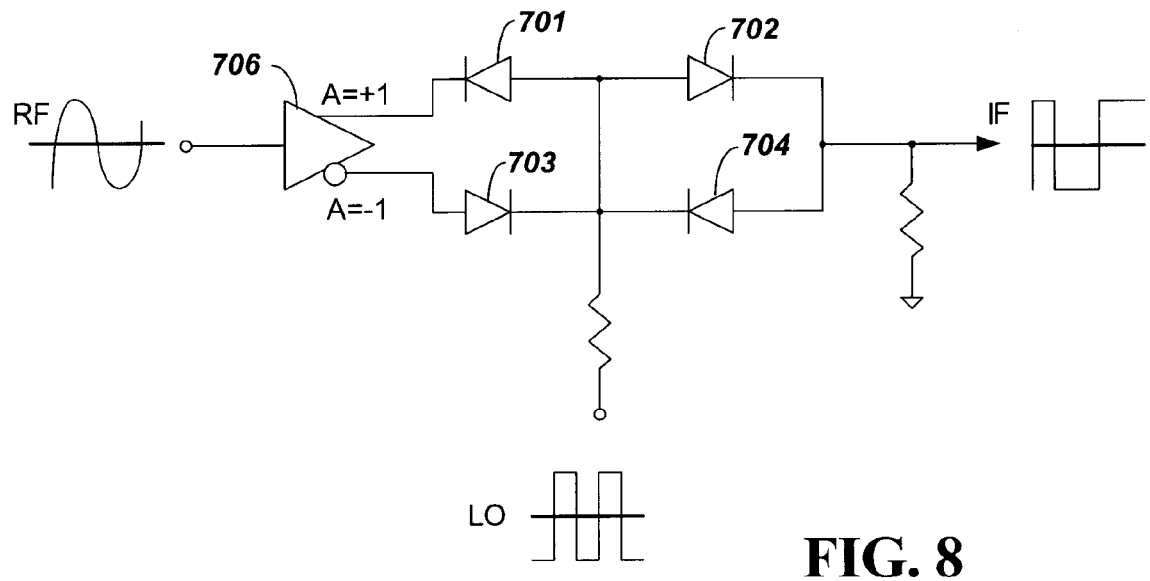
FIG. 8 shows a block diagram of a mixer circuit with the specific differential amplifier circuit of FIG. 7 represented in block diagram form, and RF, LO and IF signals represented.
Figure 9:
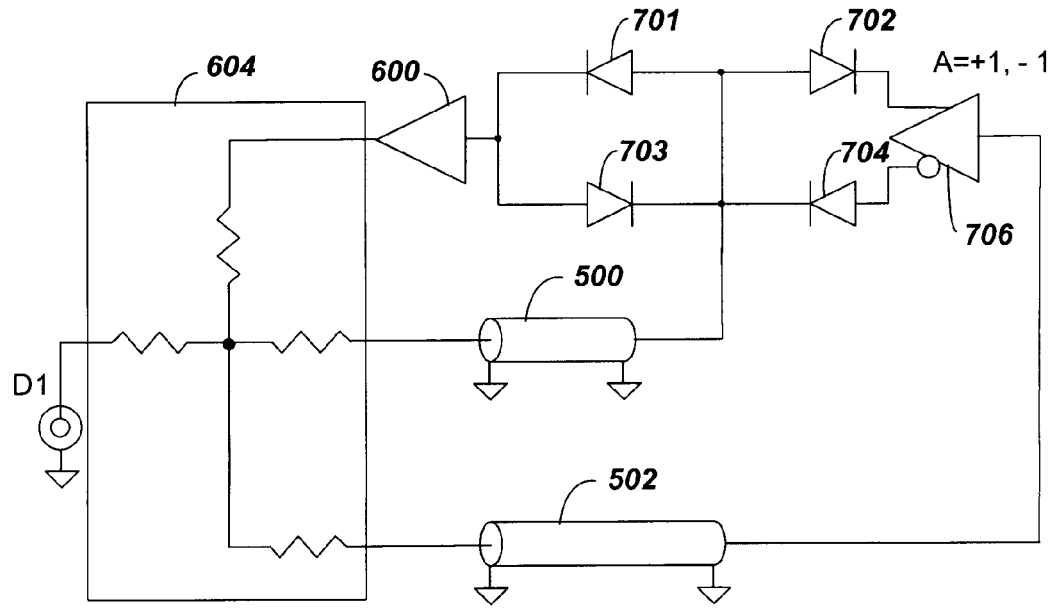
FIG. 9 shows a block diagram of components for the PBRS generator using the mixer components of FIG. 7, along with remaining PRBS components from FIG. 6.

FIG. 8 shows a block diagram of a mixer circuit with the specific differential amplifier circuit 706 of FIG. 7 represented in block diagram form. Also shown with FIG. 8 are example RF and LO signal inputs to the mixer, and a resulting IF output signal. As shown, the IF signal output behaves as if the mixer circuit were an EXOR circuit having inputs receiving the RF and LO signal inputs. FIG. 9 for reference shows a block diagram of components for the PBRS generator using the mixer components of FIG. 7, along with remaining PRBS generator components from FIG. 6.

Figure 10A:
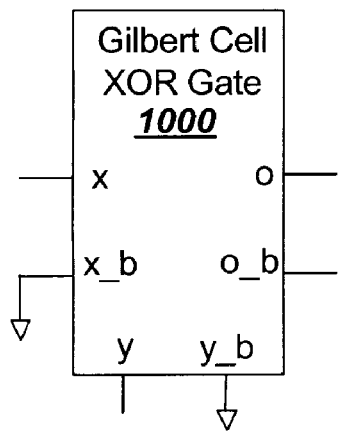
FIG. 10A shows a "Gilbert Cell" connection diagram allowing the Gilbert Cell to provide a high frequency EXOR gate for use in a PRBS generator according to additional embodiments of the present invention.

FIG. 10A shows a connection diagram for a "Gilbert Cell" 1000 to provide a high frequency EXOR gate for use in a PRBS generator according to additional embodiments of the present invention. A Gilbert Cell 1000 can be made using very high frequency transistors allowing its use as a mixer at microwave frequencies. It also has the advantage of gain. This will allow the deletion of the fixed gain amplifier 600 shown in FIGS. 6 and 9.

As illustrated in FIG. 10A, the Gilbert Cell 1000 has four inputs x, x_b, y and y_b. The input x_b has _b indicating active low, as will other all signals described herein labeled with "_b". The Gilbert Cell 1000 further provides outputs labeled o and o_b. The Gilbert Cell 1000 provides circuitry to generate the following function:

$$o-o\_b = A1(x-x\_b) * A2(y-y\_b)$$

where A1 and A2 are gains of internal differential pairs of the Gilbert Cell.

With this formula, the + or − state difference in outputs, 0 and 0_b, can be determined based on the + or − state difference between each of the inputs, x−x_b and y−y_b, as illustrated in the following Table A.

TABLE A

| x − x_b | y − y_b | o − o_b |
|---------|---------|---------|
| +       | +       | +       |
| −       | +       | −       |
| +       | −       | −       |
| −       | −       | +       |

From Table A, it can be seen that o−o_b=x−_b when y−y_b is +. Also, from the table it can be seen that o−o_b=x_b−x when y−y_b is −. Thus, with x and y as inputs, and x_b and y_b grounded, y will be inverted as the output o_b with x being +, and y will not be inverted as the output o_b with x being −. This is illustrated in Table B as follows:

TABLE B

| x | y | o_b |
|---|---|-----|
| + | + | −   |
| − | + | +   |
| + | − | +   |
| − | − | −   |

Figure 10B:
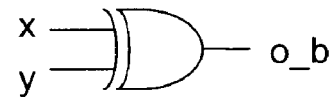
FIG. 10B illustrates how the terminals of the Gilbert Cell are configured to form an EXOR gate.

FIG. 10B, thus, illustrates how the x and y input terminals and the o_b output terminal of the Gilbert Cell 1000 can be connected to form an EXOR gate. With the x_b and y_b inputs to the Gilbert Cell 1000 connected to ground as shown in FIG. 10A, they are not used in the EXOR gate of FIG. 10B, leaving x and y as inputs. With o_b selected as an output, the following truth table, Table C, is provided for the EXOR gate of FIG. 10B:

TABLE C

| x | y | o_b |
|---|---|-----|
| 1 | 1 | 0   |
| 0 | 1 | 1   |
| 1 | 0 | 1   |
| 0 | 0 | 0   |

The + and − signals of Table B equate to the 1s and 0s in Table C. Tables B and C, thus, show that the Glibert Cell configuration of FIG. 10A provides the EXOR gate of FIG. 10B.

Figure 11:
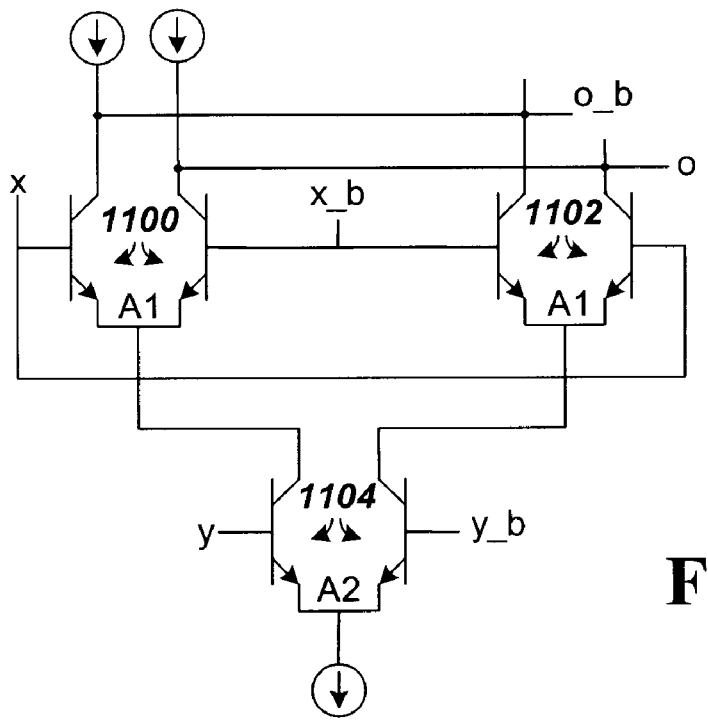
FIG. 11 illustrates circuit components making up a Gilbert Cell that can be used in a PBRS generator of embodiments of the present invention.

FIG. 11 illustrates circuit components making up a Gilbert Cell that can be used in a PRBS generator of the present invention. The circuit includes three differential amplifier pairs 1100, 1102 and 1104. The x and x_b inputs to the Gilbert Cell provide inputs to the gates of transistors of differential amplifiers 1100 and 1102. Outputs of the Gilbert Cell o and o_b are provided as the outputs at the collectors of transistors of differential amplifiers 1100 and 1102. The y and y_b inputs to the Gilbert Cell provide the gate inputs to transistors of differential amplifier 1104. The gain of differential pairs 1100 and 1102 provide the A1 gain of the Gilbert Cell, while the differential pair 1104 provides the gain A2.

Figure 12:
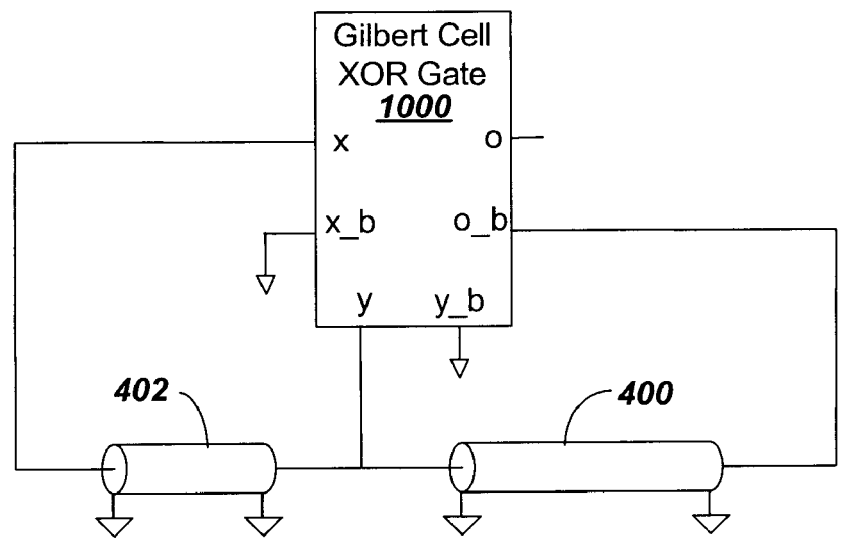
FIGS. 12 and 13 show modification of components of respective FIGS. 4 and 5 with the EXOR gate replaced with the Gilbert Cell 1000.
Figure 13:
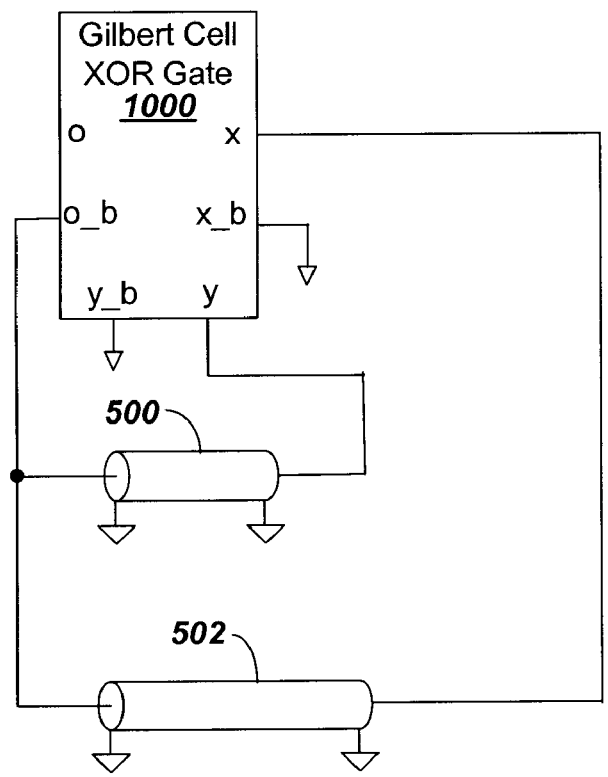

FIGS. 12 and 13 show modification of components of respective FIGS. 4 and 5 with the EXOR gate replaced with the Gilbert Cell 1000.

Figure 14:
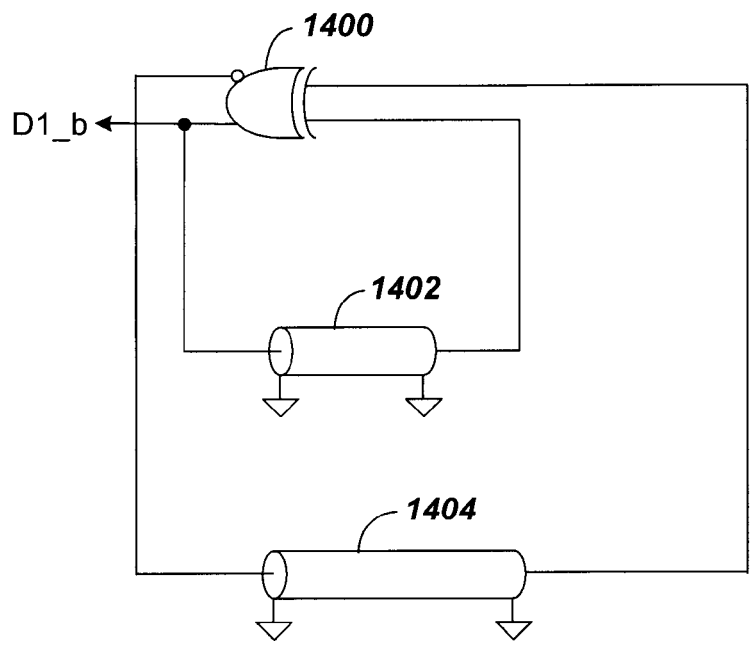
FIG. 14 shows modification of the circuit of FIG. 5 to include an EXOR gate with complementary outputs.
Figure 15:
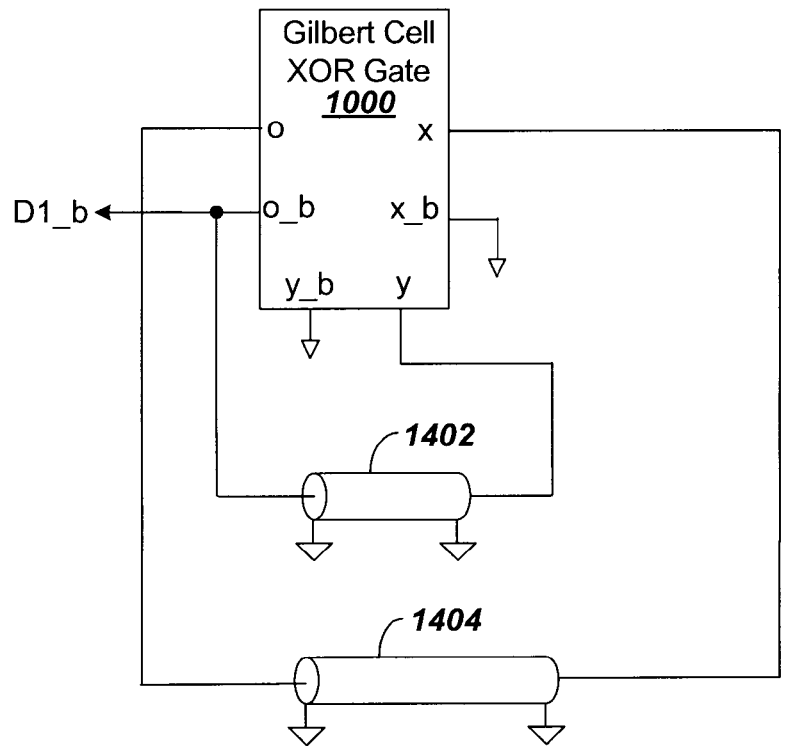
FIG. 15 shows the EXOR gate of FIG. 14 replaced by a Gilbert Cell 1000.

FIG. 14 shows modification of the circuit of FIG. 5 to include an EXOR gate 1400 with complementary outputs. This variation uses both outputs of the EXOR gate 1400. The data stream out of D1_b from the EXOR gate 1400 is the inverted version of the output D1 of FIG. 5. This implementation simplifies the drive requirements of the delay lines, as the output of EXOR gate 1400 provides separate outputs to delay lines 1402 and 1404. A power splitter to distribute the EXOR output to the two delay lines 1402 and 1402 will, thus, not be required. FIG. 15 shows the EXOR gate 1400 of FIG. 14 replaced by a Gilbert Cell 1000.

Figure 16:
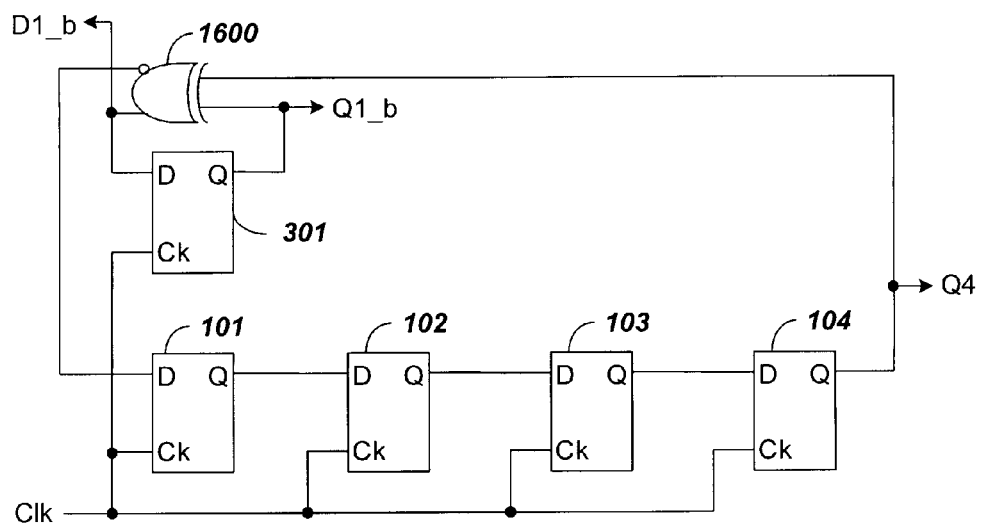
FIG. 16 shows an alternative connection for the PRBS generator of FIG. 3 using complementary outputs from an EXOR gate.

FIG. 16 shows an alternative connection for the PRBS generator of FIG. 3 using complementary outputs from an EXOR gate 1600, similar to FIG. 14. As in FIG. 3, a D flip-flop 301 redundant to D flip-flop 101 is used to provide the Q1 input to EXOR gate 1600 in FIG. 16. The EXOR gate 1600 can be replaced in FIG. 16 with a Gilbert Cell as well.

Figure 17:
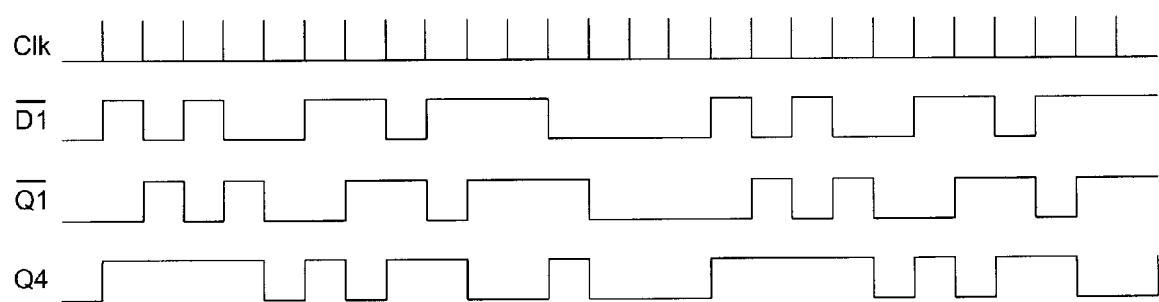
FIG. 17 is a timing diagram illustrating the outputs of the circuits of FIGS. 14-16.

The outputs D1_b, Q1_b and Q4 from FIG. 16, as well as outputs from the circuits of FIGS. 14 and 15, are shown in FIG. 17. FIG. 17 shows that the circuits of FIGS. 14-16 exhibit the same sequence as shown in FIG. 2. Note the sequence for Q4 is the same as shown in FIG. 2. D1_b and Q1_b in FIG. 17 are, however, inverted in FIG. 2.

Figure 18:
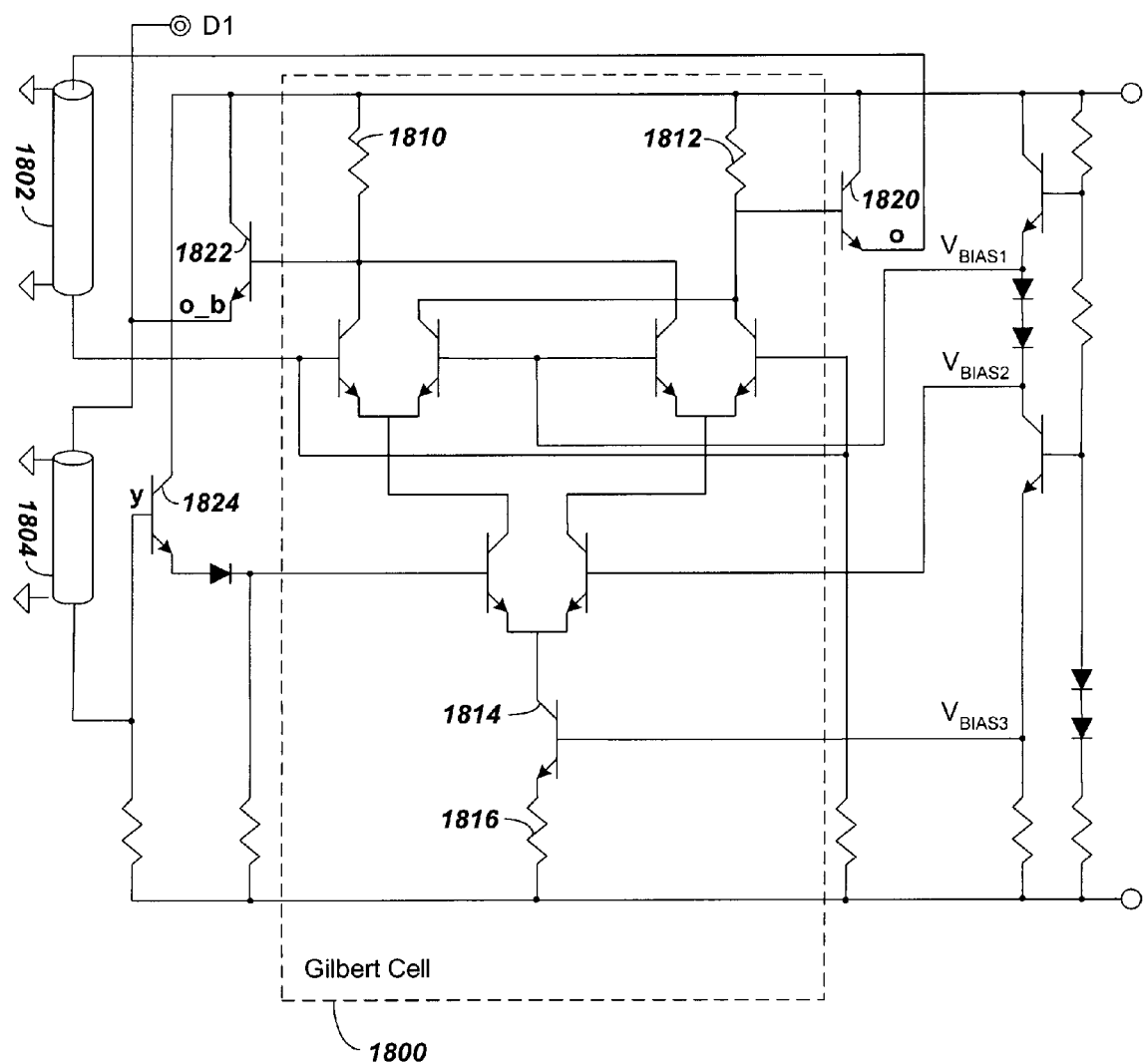
FIG. 18 shows circuitry for FIG. 16 implemented using a Gilbert Cell and two delay lines.

FIG. 18 shows circuitry for the connection of FIG. 16 implemented using a Gilbert Cell 1800 and two delay lines 1802 and 1804. The Gilbert Cell 1800 can include components as described with respect to FIG. 7. The upper two differential pair amplifiers represent the + gain and − gain amplifier outputs driving resistors 1810 and 1812. The bottom differential pair amplifier represents the diode switching function which provides the selection of either the + gain amplifier or the − gain amplifier output. Buffering of the output signal o is provided by transistor 1820. Buffering of the output signal o_b is provided by transistor 1822. Further, buffering of the input signal y is provided by transistor 1824. The remaining circuitry provides bias signals $V_{BIAS1}$, $V_{BIAS2}$ and $V_{BIAS3}$ for transistors used in the Gilbert Cell 1800.

In one exemplary embodiment for the circuit of FIG. 18, a Motorola MECL 10KH series triple EXOR gate model MC10H107 is used as the Gilbert Cell 1800. Only one of the EXOR gates in the model MC10H107 circuit is needed. With a clock frequency of 40 MHz in this example, the line length for delay lines 1802 and 1804 using coiled RG174 cable of C=29 pf/ft and R=50 Ohms can be calculated with a value of tdelay=RC=20 pf*50 Ohms=1.45 ns/ft. Thus a length for the delay line 1800 is calculated as L1=(1*1/40 MHz)/tdelay=17.24 ft. The length of delay line 1802 is calculated as L2=(4*1/40 MHz)/tdelay=68.95 ft.

Although the present invention has been described above with particularity, this was merely to teach one of ordinary skill in the art how to make and use the invention. Many additional modifications will fall within the scope of the invention, as that scope is defined by the following claims.

What is claimed is:

1. A pseudo random bit sequence (PRBS) generator comprising:
an exclusive OR (EXOR) circuit having an output providing an output of the PRBS generator:
a first delay line having an input connected to an output of the EXOR circuit, and an output connected to a first input of the EXOR circuit; and
a second delay line having an input connected to an output of the EXOR circuit, and an output connected to a second input of the EXOR circuit;
wherein the EXOR circuit comprises:
a mixer having a LO input connected to the output of the first delay line, an RF input connected to the output of the second delay line, and an IF output; and
an amplifier having an input connected to the IF output of the mixer and an output providing the output of the EXOR circuit; and
wherein the mixer of the EXOR circuit comprises:
a differential amplifier having an input forming the RF input of the mixer and first and second differential outputs;

a first diode having an anode terminal connected to the first differential output and a cathode terminal forming the LO input of the mixer;

a second diode having a cathode terminal connected to the second differential output and an anode terminal connected to the LO input;

a third diode having an anode terminal connected to the LO input and a cathode terminal connected to the IF output of the mixer; and a fourth diode having a cathode terminal connected to the input and an anode terminal connected to the IF output.

2. The PRBS generator of claim 1, wherein the output of the EXOR circuit is connected to each of the first delay line, the second delay line and the output of the PRBS generator through a separate output of a three way splitter.

3. The PRBS generator of claim 1, wherein the first delay line and the second delay line comprise different lengths of coaxial cable.

4. The PRBS generator of claim 1, wherein the first delay line and the second delay line comprise different lengths traces on a PC board.

5. A pseudo random bit sequence (PRBS) generator comprising:

an exclusive OR (EXOR) circuit having an output providing an output of the PRBS generator;

a first delay line having an input connected to an output of the EXOR circuit, and an output connected to a first input of the EXOR circuit; and a second delay line having an input connected to an output of the EXOR circuit, and an output connected to a second input of the EXOR circuit, wherein the EXOR circuit comprises a Gilbert Cell that comprises:

first and second differential amplifiers connected to provide first inputs x and x_b and outputs o and o_b for the Gilbert Cell, wherein the x_b input is connected to ground, the x input provides a first input of the EXOR circuit and the o_b output provides the output of the EXOR circuit; and a third differential amplifier connected to provide second inputs y and y_b for the Gilbert Cell, wherein the y_b input is connected to ground and the y input provides a second input of the EXOR circuit.

6. A pseudo random bit sequence (PRBS) generator comprising:

an exclusive OR (EXOR) circuit having an output providing an output of the PRBS generator;

a first delay line having an input connected to an output of the EXOR circuit, and an output connected to a first input of the EXOR circuit; and a second delay line having an input connected to an output of the first delay line and an output connected to a second input of the EXOR circuit;

wherein the EXOR gate comprises:

a mixer having a LO input connected to the output of the first delay line, an RF input connected to the output of the second delay line, and an IF output; and an amplifier having an input connected to the IF output of the mixer and an output providing the output EXOR gate, and wherein the mixer comprises a diode switch comprising:

a differential amplifier having an input forming the RF input of the mixer and first and second differential outputs;

a first diode having an anode terminal connected to the first differential output and a cathode terminal forming the LO input of the mixer;

a second diode having a cathode terminal connected to the second differential output and an anode terminal connected to the LO input;

a third diode having an anode terminal connected to the LO input and a cathode terminal connected to the IF output of the mixer; and a fourth diode having a cathode terminal connected to the input and an anode terminal connected to the IF output.

7. A pseudo random bit sequence (PRBS) generator comprising:

an exclusive OR (EXOR) circuit having a first output and a second output complementary to the first;

a first delay line having an input connected to the first output of the EXOR circuit, and an output connected to a first input of the EXOR circuit; and a second delay line having an input connected to the second complementary output of the EXOR circuit, and an output connected to a second input of the EXOR circuit wherein the EXOR circuit comprises a Gilbert Cell, wherein the Gilbert Cell comprises:

first and second differential amplifiers connected to provide first inputs x and x_b and outputs o and o_b for the Gilbert Cell, wherein the x_b input is connected to ground, the x input provides a first input of the EXOR gate and the o_b output provides the first output of the EXOR gate, and the o output provides the second output of the EXOR gate; and a third differential amplifier connected to provide second inputs y and y_b for the Gilbert Cell, wherein the y_b input is connected to ground and the y input provides a second input of the EXOR gate.

* * * * *